United States Patent
Kuo et al.

(10) Patent No.: US 7,443,732 B2
(45) Date of Patent: Oct. 28, 2008

(54) HIGH PERFORMANCE FLASH MEMORY DEVICE CAPABLE OF HIGH DENSITY DATA STORAGE

(75) Inventors: Tiao-Hua Kuo, San Jose, CA (US); Nancy Leong, Sunnyvale, CA (US); Nian Yang, Mountain View, CA (US); Guowei Wang, Cupertino, CA (US); Aaron Lee, Mountain View, CA (US); Sachit Chandra, Sunnyvale, CA (US); Michael A. VanBuskirk, Saratoga, CA (US); Johnny Chen, Sunnyvale, CA (US); Darlene Hamilton, San Jose, CA (US); Binh Quang Le, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 491 days.

(21) Appl. No.: 11/229,527

(22) Filed: Sep. 20, 2005

(65) Prior Publication Data
US 2007/0064464 A1 Mar. 22, 2007

(51) Int. Cl.
*G11C 11/34* (2006.01)
(52) U.S. Cl. ............... 365/185.22; 365/185.3
(58) Field of Classification Search ............ 365/100, 365/185.22, 185.3, 185.29, 185.23, 185.24, 365/185.25
See application file for complete search history.

(56) References Cited

U.S. PATENT DOCUMENTS

| 5,270,979 A | 12/1993 | Harari et al. |
| 5,495,442 A | 2/1996 | Cernea et al. |
| 5,497,119 A * | 3/1996 | Tedrow et al. ............ 327/540 |
| 5,638,326 A | 6/1997 | Hollmer et al. ............ 365/185 |
| 5,646,890 A | 7/1997 | Lee et al. |
| 6,327,181 B1 | 12/2001 | Akaogi et al. ............ 365/185 |
| 6,424,570 B1 | 7/2002 | Le et al. ................ 365/185 |
| 6,452,869 B1 | 9/2002 | Parker .................. 365/238 |
| 6,487,121 B1 | 11/2002 | Thurgate et al. ........... 365/185 |
| 6,538,923 B1 | 3/2003 | Parker .................. 365/185 |
| 6,744,675 B1 | 6/2004 | Zheng et al. |
| 6,747,900 B1 | 6/2004 | Park et al. ............... 365/185 |

(Continued)

FOREIGN PATENT DOCUMENTS

EP 0 762 429 A2 3/1997

OTHER PUBLICATIONS

International Search Report and Written Opinion dated Apr. 17, 2007, issued in corresponding PCT Application No. PCT/US2006/035029.

(Continued)

*Primary Examiner*—Richard Elms
*Assistant Examiner*—Hien N Nguyen
(74) *Attorney, Agent, or Firm*—Harrity & Harrity, LLP

(57) ABSTRACT

A method is provided for programming a nonvolatile memory array including an array of memory cells, where each memory cell including a substrate, a control gate, a charge storage element, a source region and a drain region. The method includes receiving a programming window containing a predetermined number of bits that are to be programmed in the array and determining which of the predetermined number of bits are to be programmed in the memory array. The predetermined number of bits are simultaneously programmed to corresponding memory cells in the array. A programming state of the predetermined number of bits in the array is simultaneously verified.

21 Claims, 10 Drawing Sheets

U.S. PATENT DOCUMENTS

| | | | | |
|---|---|---|---|---|
| 6,847,555 B2 * | 1/2005 | Toda | ..................... | 365/185.21 |
| 7,020,019 B2 * | 3/2006 | Salessi et al. | .......... | 365/185.04 |
| 2002/0109539 A1 | 8/2002 | Takeuchi et al. | | |
| 2006/0164888 A1 * | 7/2006 | Pisasale et al. | ......... | 365/185.18 |

OTHER PUBLICATIONS

2002 IEEE International Solid-State Circuits Conference, Session 6, "SRAM and Non-Volatile Memories," Feb. 4, 2004, 6 pages.

2002 IEEE International Solid-State Circuits Conference, 23 pages.

* cited by examiner

HIGH PERFORMANCE FLASH MEMORY DEVICE CAPABLE OF HIGH DENSITY DATA STORAGE

TECHNICAL FIELD

The present invention relates generally to non-volatile memory devices, and more specifically, to improving operations associated with non-volatile memory devices.

BACKGROUND ART

Flash memory is a common type of non-volatile semiconductor memory device. Non-volatile refers to the retaining of stored data when power is turned off. Because flash memory is non-volatile, it is commonly used in power conscious applications, such as in battery powered cellular phones, personal digital assistants (PDAs), and in portable mass storage devices such as memory sticks.

Flash memory devices typically include multiple individual components formed on or within a substrate. For example, a flash memory may include one or more high density core regions and a low density peripheral portion formed on a single substrate. The high density core regions typically include arrays of individually addressable, substantially identical floating-gate type memory cells. The low density peripheral portion may include input/output (I/O) circuitry, circuitry for selectively addressing the individual cells (such as decoders for connecting the source, gate and drain of selected cells to predetermined voltages or impedances to effect designated operations of the cell such as programming, reading or erasing), and voltage regulation and supply circuitry.

In a conventional flash memory architecture, memory cells within the core portion are coupled together in a circuit configuration in which each memory cell has a drain, a source, and a stacked gate. In operation, memory cells may be addressed by circuitry in the peripheral portion to perform functions such as reading, erasing, and programming of the memory cells.

Flash memory typically includes two distinct types: NOR flash memory, and NAND flash memory. Generally speaking, conventional NOR flash memory is considered to be a code-level memory, while NAND flash memory is considered to be a data-level memory. More specifically, NOR flash memory is typically configured to provide a very reliable storage environment and to further enable fast and random reading of each memory cell in the device. This is accomplished by providing individual contacts to each cell in the device. The reliability and random access nature of the NOR architecture make NOR flash memory particularly suitable for code storage, such as mobile phone and set top box operating systems, etc. Unfortunately, the individually addressable nature of conventional NOR flash memory cells tends to limit the speed at which cells may be programmed and erased as well as limit rapid reductions in device sizes. Typical NOR flash memory devices have program rates on the order of 0.4 megabytes per second (MB/s) and erase rates on the order of 0.3 MB/s.

NAND flash memory, on the other hand, is configured to enable serial or page-based access to data stored therein. This is accomplished by linking memory cells to each other and only providing access to the cells as a group or page. This architecture has the advantage of enabling decreased device sizes and also for providing fast write times. However, because each cell is not individually addressable, NAND devices are generally considered less reliable and therefore more suitable for data storage than code storage. Typical NAND flash memory devices have program rates on the order of 8 MB/second and erase rates on the order of 60 MB/second.

DISCLOSURE OF THE INVENTION

One aspect of the invention is directed to a method for programming a nonvolatile memory array including an array of memory cells, where each memory cell including a substrate, a control gate, a charge storage element, a source region and a drain region. The method includes receiving a programming window containing a predetermined number of bits that are to be programmed in the array and determining which of the predetermined number of bits are to be programmed in the memory array. The predetermined number of bits are simultaneously programmed to corresponding memory cells in the array. A programming state of the predetermined number of bits in the array is simultaneously verified.

Another aspect is directed to a memory device including at least one array of non-volatile memory cells. A voltage supply component is configured to generate a programming voltage for simultaneously programming a plurality of the memory cells, the voltage supply component that may include a high voltage pump or a DC-to-DC converter.

Yet another aspect is directed to a memory device including a core array having at least one array of non-volatile memory cells. The at least one array may include a plurality of bit lines each connected to source or drain regions of a plurality of the memory cells, and a plurality of word lines, arranged orthogonally to the bit lines, each word line being connected to gate regions of a plurality of the memory cells. A plurality of sense amplifiers may be operatively connected to the plurality of bit lines for sensing a threshold voltage for memory cells connected to the bit lines. A high voltage supply component may be configured to generate a programming voltage for simultaneously programming a plurality of the memory cells, the high voltage supply component including a DC-to-DC converter. Control logic may be configured to receive a programming window containing a predetermined number of bits that are to be programmed in the at least one array, and determine which of the predetermined number of bits are to be programmed in the memory array. Control logic may be configured to pre-charge bit lines associated with the predetermined number of bits. Control logic may be configured to simultaneously program the predetermined number of bits to corresponding memory cells in the array. Control logic may be configured to simultaneously verify a programming state of the predetermined number of bits in the array.

BRIEF DESCRIPTION OF THE DRAWINGS

Reference is made to the attached drawings, wherein elements having the same reference number designation may represent like elements throughout.

BEST MODE FOR CARRYING OUT THE INVENTION

Techniques described below relate to a flash memory programming and reading techniques in which program speed, read speed are increased with advanced power consumption schemes.

Memory Device Overview

Figure 1:
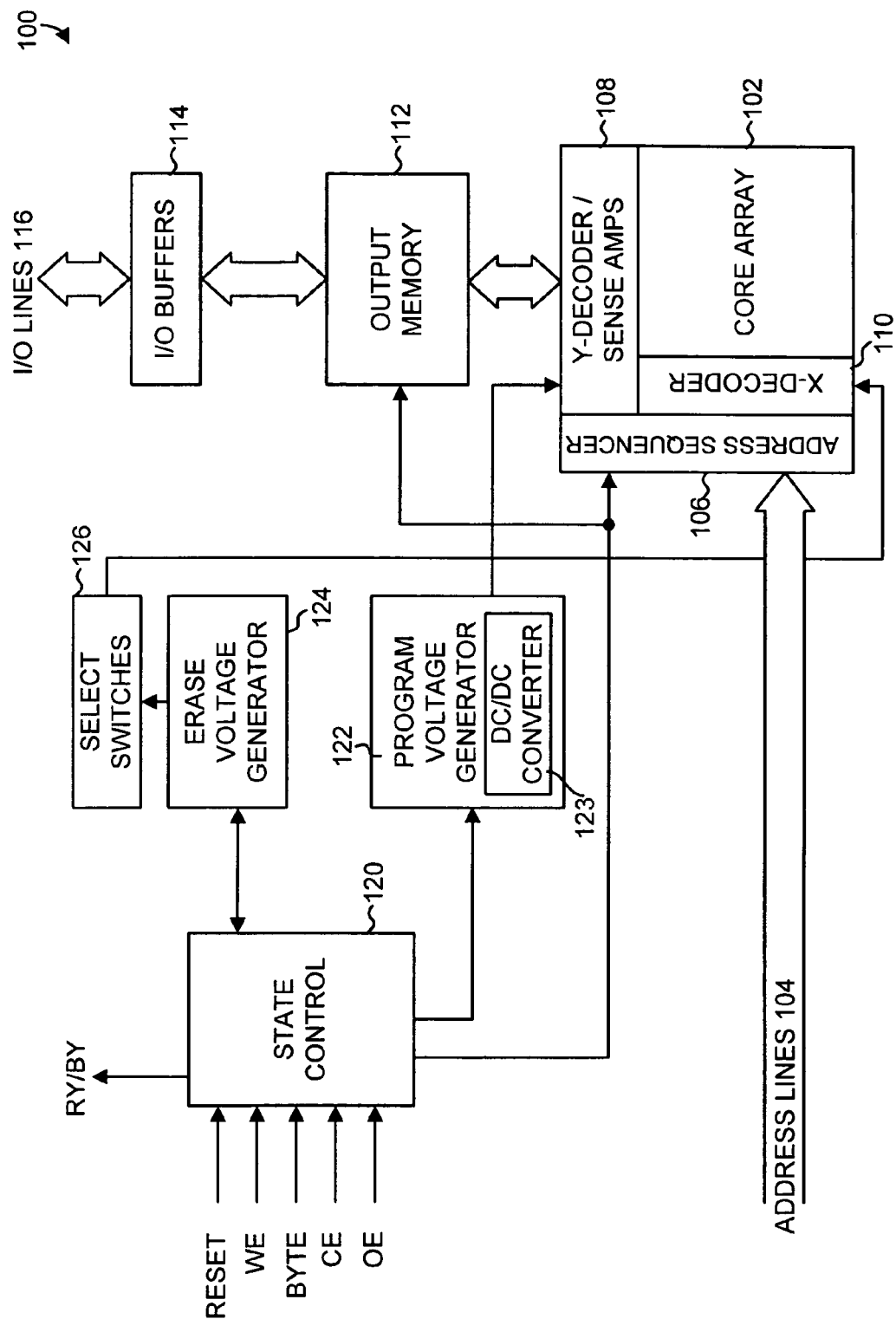
FIG. 1 is a block diagram illustrating an exemplary high-level implementation of a memory device.

FIG. 1 is a block diagram illustrating an exemplary high-level implementation of a memory device 100. Memory device 100 may be a flash memory device implemented as an integrated circuit.

As shown in FIG. 1, memory device 100 includes a core array 102. Core array 102 may include arrays of high density memory cells, such as, for example, SONOS-type (silicon-oxide-nitride-oxide-silicon) memory cells, where the nitride layer acts as the charge storage element. More specifically, core array 102 may include multiple M×N memory arrays of substantially identical memory cells. As will be discussed in more detail below, core array 102 may be a sequential access memory in which memory cells may be accessed in designated groups, such as pages or partial pages. In this manner, core array 102 may adopt an interface structure that allows high speed data transfer and data buffering comparable to or even better than a NAND counterpart, regardless of the inherent physical NOR array structure contained within the memory device 100. Physically, in one implementation consistent with principles of the invention, a page of data may refer to a series of rows (e.g., four sequential word lines) of memory cells in core array 102. It should be understood that a page of data may include any suitable number of rows. Logically, pages can be thought of as blocks of data having predetermined sizes through which memory device 100 is accessed. In one implementation, the page size for memory device 100 is approximately two-thousand bytes (i.e., 2 k bytes).

Core array 102 may be accessed by providing an address for a page via address lines 104 to address sequencer 106. Address sequencer 106 may receive input address values and distribute them to Y-decoder 108 and X-decoder 110. Decoders 108 and 110 may decode the address values so that the source, gate, and drains of the memory cells referred to by the received addresses are activated and their data values read, programmed, or erased. The decoded addresses specify the appropriate physical lines in the memory cell array(s) that are to be used. For instance, a page of data may be activated and read out of core array 102 in parallel. The read data may be written to output memory 112 before being clocked to input/output (I/O) buffers 114 and read out via I/O lines 116. Y-decoder 108 may also include appropriate sense amplifier circuitry. Sense amplifiers may be used to sense the programmed or non-programmed state of the memory cells in core area 102. Sense amplifiers consistent with the invention may be low power sense amplifiers, as described in additional detail below.

In some implementations, the memory cells in array 102 may be implemented such that each memory cell can store two or more bits. In one such multi-bit per memory cell technology, called MirrorBit™, the intrinsic density of a flash memory array can be doubled by storing two physically distinct charges on opposite sides of a memory cell. Each charge, representing a bit within a cell serves as binary unit of data (e.g. either "1" or "0"). Reading or programming one side of a memory cell occurs independently of the data that is stored on the opposite side of the cell.

Output memory 112 may include static random access memory (SRAM) or dynamic random access memory (DRAM) type memory that can serve as a memory cache between core area 102 and I/O buffers 114. Output memory 112 may thus be a volatile memory (i.e., loses its data when powered down) and, relative to the memory cells in core array 102, may be a high speed memory.

As also shown in FIG. 1, memory device 100 can include a number of additional logic components that assist in reading/writing to core array 102. In particular, as shown, memory device 100 includes a state control component 120, a program voltage generator 122, an erase voltage generator 124, and select switches 126. These elements are shown in FIG. 1 as separate elements. It should be understood that the functions performed by two or more of these components may alternatively be performed by a single component.

State control component 120 may implement a state machine that dictates the function of memory device 100 based on a number of control signals, illustrated as the signals such as reset line 132, write enable (WE) line 134, byte line 136, chip enable (CE) line 138, output enable (OE) line 140, as well as read control, write protection, etc. Reset line 132, when activated, causes a hardware reset of memory device 100. Write enable line 134 enables writing of data to core array 102. Byte line 136 selects the width of the output data bus. For example, byte line 136 may cause I/O lines 116 to function as an eight-bit data bus or a sixteen-bit data bus, depending on the state of byte line 136. Chip enable line 138 enables the reading/writing of data to memory device 100. When chip enable line 138 is held at its designated non-active level, the output pins of memory device 100 may be placed in a high impedance (non-active) state. To activate the memory device 100, chip enable line 138 may be held in its active state. Output enable line 140 enables reading of data from core array 102 and outputting the data via I/O lines 116.

Program voltage generator 122 and erase voltage generator 124 may generate the appropriate voltages needed for reading, writing, and erasing from/to core array 102. For example, in one implementation, core array 102 may require relatively high voltages to erase and program the memory cells in core array 102. These higher voltages may be provided from program voltage generator 122 and erase voltage generator 124.

Conventional program voltage generators typically include a charge pump for increasing or amplifying a voltage source to reach a voltage level required for programming one or more bits in array 102. A charge pump, as is generally known in the art, may include a series of stages that each include diode(s) and capacitor(s) that are operated to "push" charge through the various stages of the charge pump in order to provide a higher output voltage than the input supply voltage. This output voltage may then be applied to various portions of the memory cells as a voltage pulse.

Unfortunately, charge pumps are typically the largest source of power consumption (e.g., current) on a memory device. Moreover, such charge pumps typically have an efficiency of approximately 45%. For example, in a memory device having a 1.8 volt input voltage and requiring a 1.0 mA output current and 7.0 volt output voltage during a program operation, it has been found that a conventional charge pump requires a current draw of approximately 8.64 mA to program the device.

In accordance with one implementation consistent with principles of the invention, program voltage generator 122 may include a DC-to-DC converter 123 for performing the voltage amplification typically performed by a charge pump. DC-to-DC converter 123 performs voltage amplification by incorporating an inductor. It has been found that using DC-to-DC converter 123 results in an improved efficiency of approximately 80% associated with conventional program voltage generator 122. Accordingly, for the above example, a current draw of only about 4.86 mA may be required for programming a 1.8 volt device.

Select switches 126 may include select transistors connected to core array 102. Each select switch may be used to control a series of memory cells, such as a column of memory cells.

Figure 2:
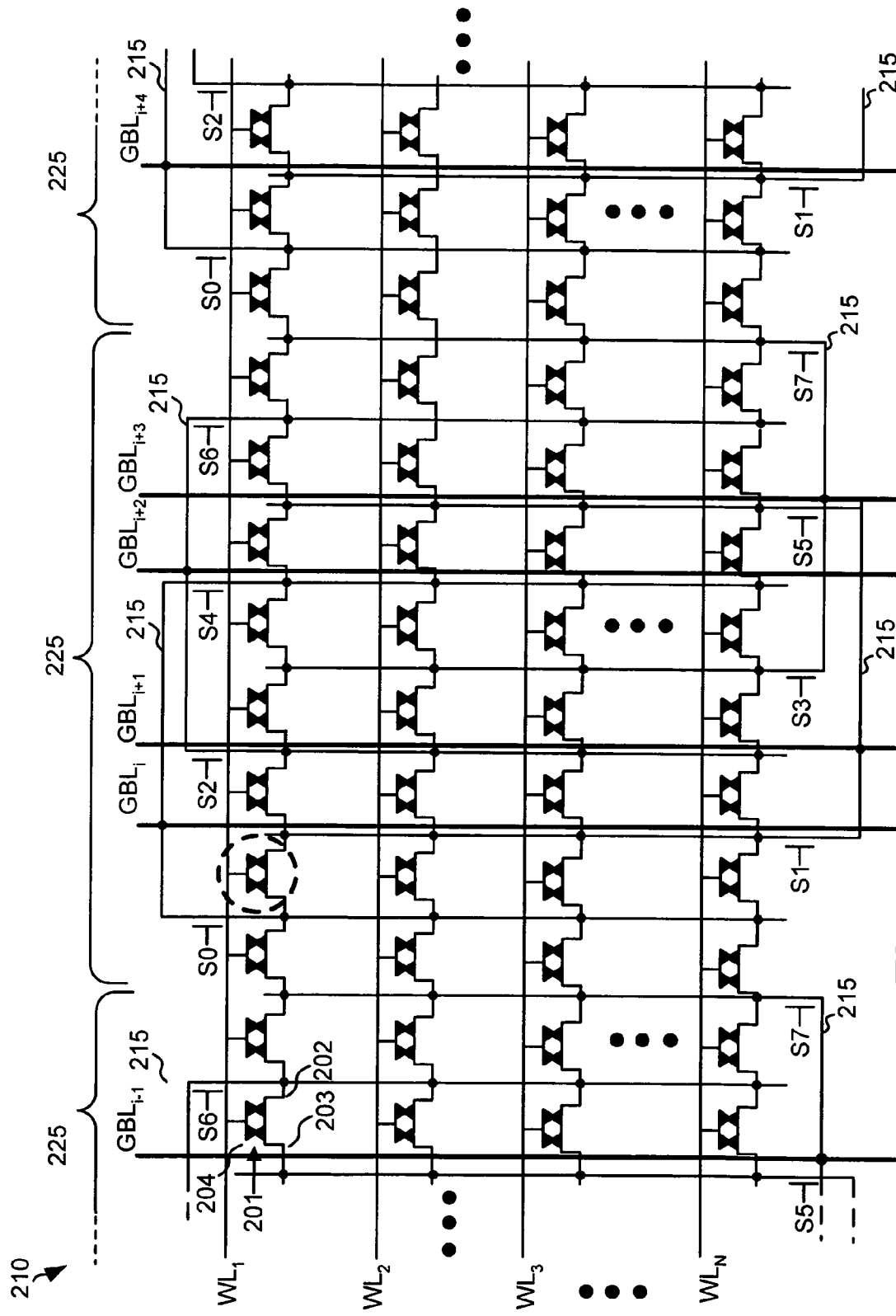
FIG. 2 is a diagram illustrating an exemplary portion of an array of memory cells implemented in the core area shown in FIG. 1.

FIG. 2 is a diagram illustrating an exemplary portion of an array of memory cells implemented in core area 102, labeled as memory array 210. The array includes a number of substantially identical memory cells 201. Each memory cell 201 includes a drain 202, a source 203, and a stacked gate region 204. Drain 202 and source 203 are interchangeable within a memory cell depending on the applied voltages and may be switched with respect to one another. The configuration illustrated in FIG. 2 includes word lines (word lines $WL_1$ through $WL_N$) each connected to the gate region 204 of a number of memory cells in a row. Bit lines are arranged orthogonally to the word lines in array 210. The bit lines include global bit lines ($GBL_{i-1}$ through $GBL_{i+4}$) that each connect to one or more additional bit lines 215. Voltages placed on additional bit lines 215 via a global bit line GBL may be controlled through select transistors (also called select switches) S0 through S7.

As illustrated in FIG. 2, select transistors S0 through S7 may be arranged in repeating groups 225 of select transistors. Corresponding select transistors in a number of groups may be controlled by the same control signal. For example, activating select transistor S0 may connect the particular bit line connected to S0 to voltages applied to $GBL_i$, $GBL_{i+2}$, etc. If select transistor S1 was also activated, $GBL_{i+1}$, $GBL_{i+3}$, etc., would also be connected to the opposing source/drain of a number of memory cells in memory array 210. By also activating a word line WL, one memory cell in each group 225 may have its source, drain, and gate terminals all activated, thus allowing programming or reading of this select memory cell 201. As an example of selecting a particular memory cell 201 within a group 225 (e.g., the memory cell within the dotted circle in FIG. 2), assume that a voltage is placed on $WL_1$ and that S0 and S1 are turned-on and that voltages are placed on $GBL_i$ and $GBL_{i+1}$. At this point, this cell has voltages applied to its gate, source, and drain and may be programmed or read. Other memory cells 201 in other groups 225 can be simultaneously selected based on activation of the same WL and select transistors.

Although only six global bit lines and four word lines are shown in FIG. 2, one of ordinary skill in the art will recognize that a typical memory cell architecture will include many more cells in an array. For instance, in one implementation, core array 102 may include multiple memory cell arrays, each including 2048 bit lines and 256 word lines. The 2048 bit lines correspond to 256 eight memory cell groups 225 of select transistors.

Although the memory cells 201 in core area 102 are used as NOR memory, in some implementations, the circuitry in the peripheral regions of memory device 100 may provide an external interface that mimics an external interface normally provided by NAND-type flash memories. In this situation, memory device 100, from the point of view of the user/circuit designer, can effectively be thought of as a NAND-type flash device even though core area 102 has been used as NOR-type flash memory.

Figure 3:
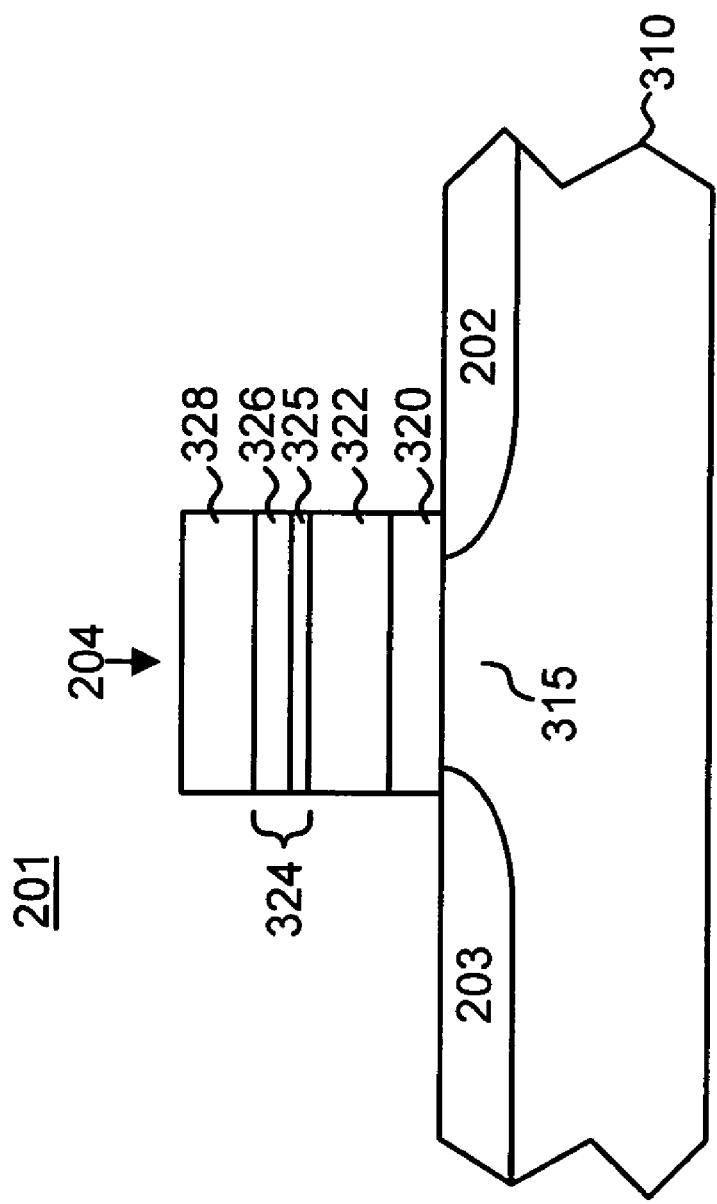
FIGS. 3 and 4 are diagrams illustrating a cross-section of an exemplary one of the memory cells shown in FIG. 2.

FIG. 3 is a diagram illustrating a cross-section of an exemplary one of memory cells 201 in more detail. Memory cell 201 may be formed on a substrate 310 and includes drain 202, source 203, and stacked gate 204. Substrate 310 may be formed of a semiconducting material such as silicon, germanium, or silicon-germanium. Drain and source regions 202 and 203 may be regions that are doped with n-type impurities, such as phosphorous or arsenic. As previously mentioned, depending on the applied voltage values, the functions of drain and source regions 202 and 203 may be reversed.

As shown in FIG. 3, stacked gate 204 is formed on channel region 315. Stacked gate 204 includes a number of layers, including a relatively thin gate dielectric layer 320, a charge storage layer 322, a second dielectric layer 324, and a control gate 328. Dielectric layer 320 may include an oxide, such as a silicon oxide (e.g., $SiO_2$).

Charge storage layer 322 may be formed on gate dielectric layer 320 and may include a dielectric material, such as a nitride (e.g., a silicon nitride). Layer 322 acts as a charge storage layer for memory cell 201.

Charge storage layer 322 may be used to store one or more bits of information. In an exemplary implementation, charge storage layer 322 may store charges representing two separate bits of data by localizing the first and second charges to the respective left and right sides of charge storage layer 322. Each of the two charges of the memory cell 201 may be programmed independently by, for example, channel hot electron injection, to store a charge on each respective side of the charge storage layer 322. In this manner, the charges in charge storage layer 322 become effectively trapped on each respective side of charge storage layer 322 and the density of the resulting memory array may be increased as compared to memory devices that store only one bit of data per cell. In alternate implementations, charge storage layer 322 may store charges representing three or more bits of data for each memory cell 201.

Second dielectric layer 324 may be formed on layer 322 and may include a multi-layer structure, such as a first silicon oxide layer 325 and a second high dielectric constant (high-K) layer 326. High-K layer 326 may include, for example, an alumina, such as $Al_2O_3$. Dielectric layers 325 and 326 may together function as an inter-gate dielectric for memory cells 201. In alternate implementations, dielectric layer 324 may include a single layer, such as a silicon oxide or alumina.

Control gate 328 may be formed above second dielectric layer 324. Control gate 328 may be formed of, for example, polysilicon and may be connected to the word line of memory cell 201.

In operation, core area 102 of memory device 100 may be programmed by a channel hot electron injection process that injects electrons into charge storage layer 322. The injected electrons become trapped in charge storage layer 322 until an erase operation is performed.

Memory cells 201 in core array 102 may be programmed by applying a relatively high voltage (e.g., 7 volts) to one of the word lines WL, such as $WL_1$, which effectively applies the voltage to control gates 328 of the memory cells that are coupled to $WL_1$. Simultaneously, a voltage may be applied across drain 202 and source 203 of one of the memory cells in a group 225. For example, approximately five volts may be applied to $GBL_i$ and $GBL_{i+1}$ may be grounded. Also, select transistors S0 and S1 may be turned on by applying an appropriate voltage to S1. These voltages generate a vertical and lateral electric field in the activated memory cell(s) (e.g., the circled memory cell in FIG. 2) along the length of the channel from the source to the drain. These electric fields causes electrons to be drawn off the source and begin accelerating toward the drain. As they move along the length of the channel, they gain energy. If they gain enough energy, they can jump over the potential barrier of the dielectric layer 320 into one side of charge storage layer 322 and become trapped. The trapped electrons change the electrical properties of the memory cell. In a read operation, the source and drain terminals are interchanged. For example, the corresponding read operation may be performed by applying approximately three volts to $WL_1$, grounding $GBL_i$, and applying approximately 1.5 volts to $GBL_{i+1}$.

Figure 4:
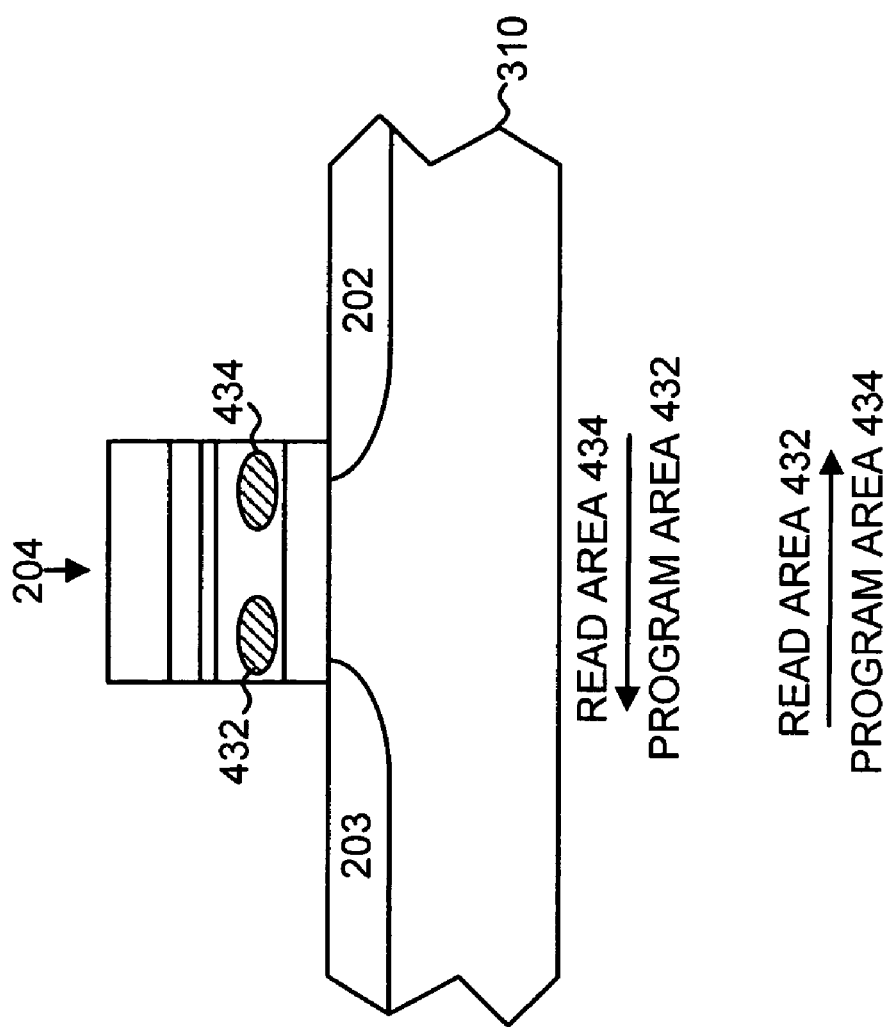

When two bits are stored in charge storage layer 322, the second bit is programmed in a manner similar to the first bit, except that the source and drain terminals are reversed in both directions. FIG. 4 is a diagram illustrating a cross-section of the exemplary memory cell shown in FIG. 3. Additionally, FIG. 4 illustrates read and program directions for when memory cell 201 is used to store charges representing two independent bits. Memory cell 201 includes two separate charge storage areas 432 and 434 within charge storage layer 322. Each storage area 432 and 434 may define one bit. To program the left area 432 or read the right area 434, area 203 acts as the drain and receives a high voltage relative to area 202, which acts as the source. To program the right area 434 or read the left area 432, area 202 acts as the drain and receives a high voltage relative to area 203, which acts as the source. The arrows in FIG. 4 graphically illustrate the direction of charge flow.

Memory Device Programming

As previously mentioned, in accordance with the principles of the invention, multiple memory cells 201 in a row (i.e., the memory cells 201 having a common word line) may be simultaneously or parallel programmed by activating a word line and pairs of select transistors S0 through S7 in different groups 225. Parallel programming multiple memory cells 201 can be conceptually thought of as programming multiple memory cells within a "program window." In the exemplary implementation described herein, the program window size will be described as being 256 bits wide. That is, programming is performed in 256-bit chunks. One of ordinary skill in the art will recognize that other program window sizes could be used, such as 512 bits.

Figure 6:
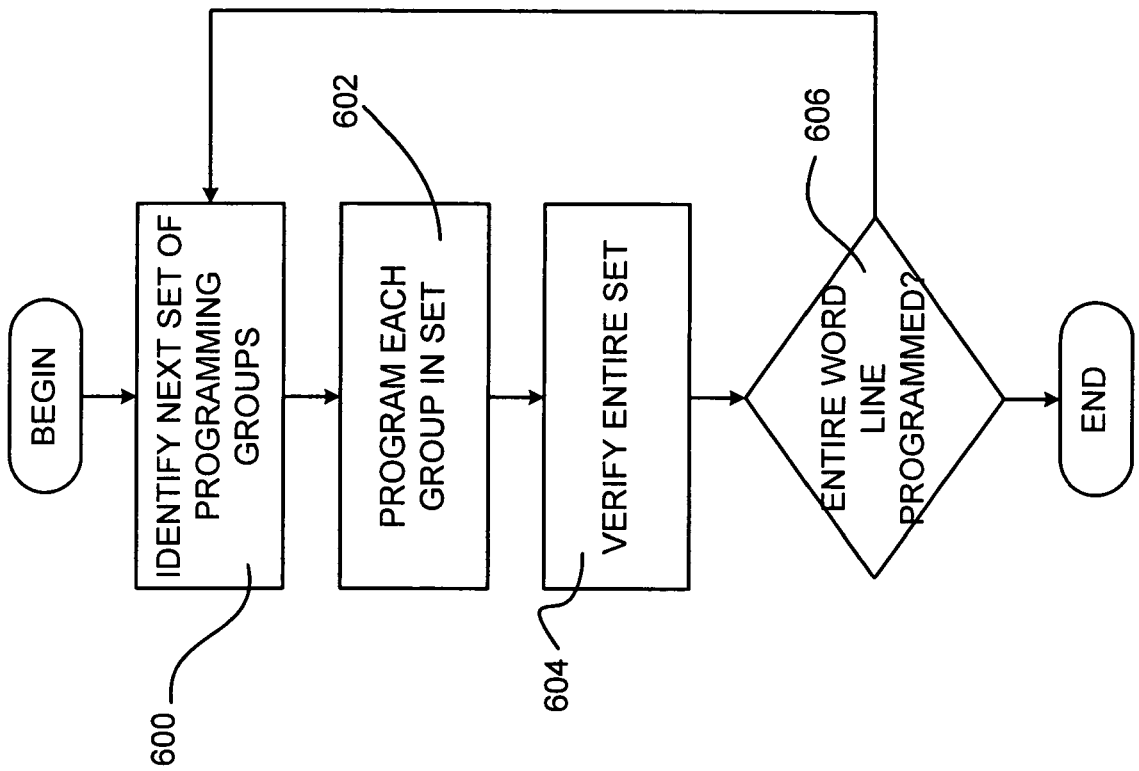
FIG. 6 is a flow chart illustrating exemplary programming of a typical NOR memory device.

FIG. 6 is a flow chart illustrating exemplary programming of a typical NOR memory device. As known in the art, in a conventional NOR memory array, a first set of 8-bit groups (e.g., eight 8-bit groups) is initially identified (act 600). Each 8-bit grouping may then be sequentially programmed (act 602). Following programming of each 8-bit group in the first set, the entire first set (e.g., 64-bits) is program verified (act 604). It is then determined whether the entire word line has been programmed (act 606). If so, the operation ends; however, if the entire word line has not bee programmed, the process returns to act 602 for programming of the next set. The process iterates until the entire word line is programmed/verified.

Unfortunately, the speed at which the program/verify operation may be performed is degraded due to periodic ramping up and down of the high program voltages as well as the periodic nature of the sense amplifier circuitry.

In accordance with principles of the invention, the same physical array, may be electrically divided into a series of programming windows/sub-windows. Once accomplished, window-based programming operations may be performed along the entire word line without requiring resetting of the high voltage circuits or sense amplifier circuitry by taking advantage of the output memory buffer 112. The output memory buffer 112 may be used to store programming data from the user as well as verification data from sense amplifier circuitry 108. Accordingly, the overhead time taken in switching operation modes like convention systems is significantly reduce thereby improving device efficiency.

Figure 5:
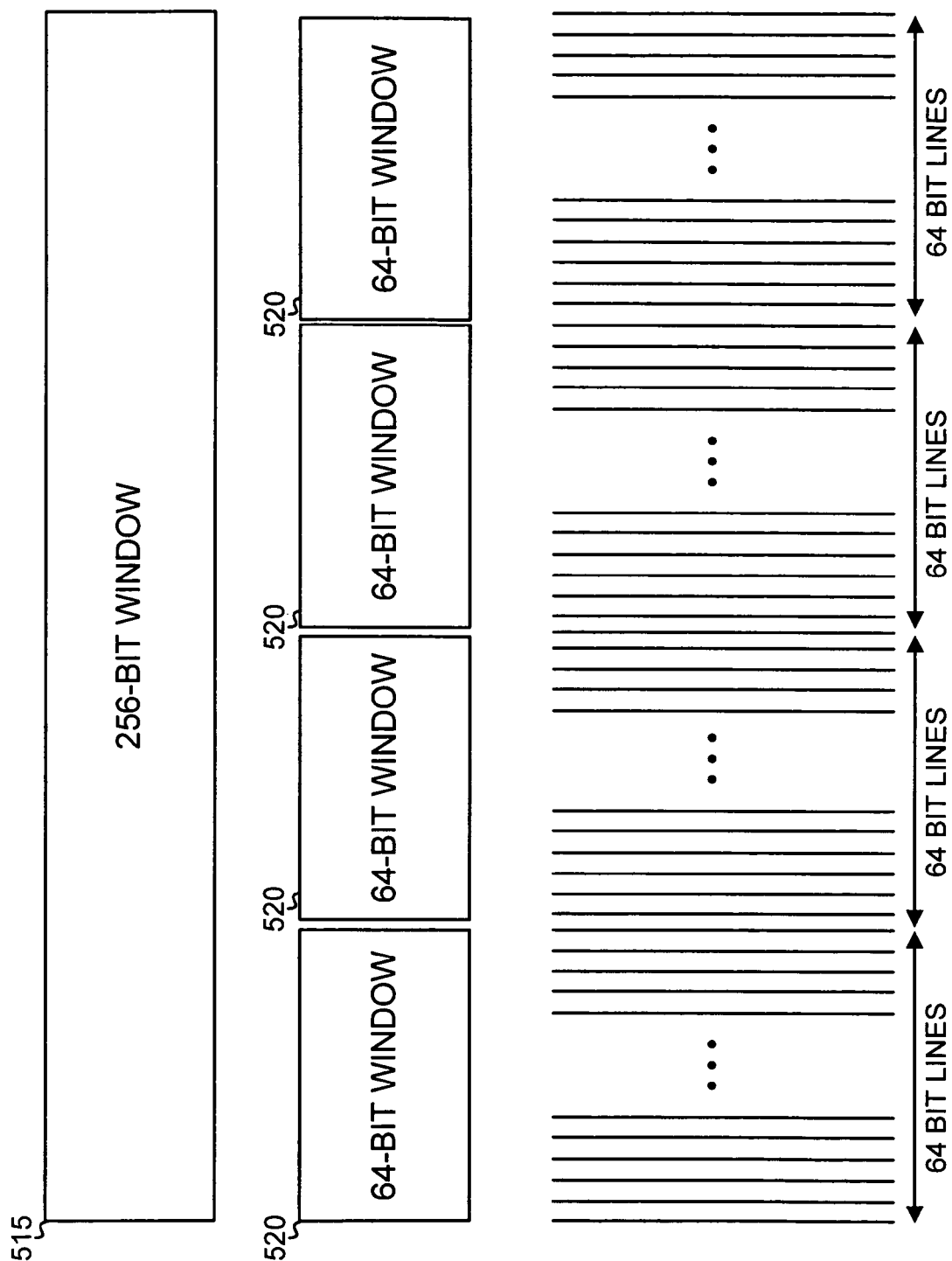
FIG. 5 is a diagram illustrating the concept of a programming window.

One programming window 515 is illustrated in FIG. 5. Programming window 515 may include the 256 bits that are to be written to core area 102. Based on each of the bits in programming window 515, memory device 100 may determine whether the physical memory cell 201 or portion of memory cell 201 that corresponds to the bit needs to be programmed. Programming window 515 may be further subdivided into sub-windows 520, such as by subdividing the 256 bits in programming window 520 into four 64-bit windows. For a 512-bit programming window, four 128-bit sub-windows may be used. The four 64-bit windows 520 may then be parallel programmed to core area 102. By simultaneously programming memory device 100 using 64-bit programming sub-windows, programming of the device may be accomplished approximately eight times faster than conventional NOR memory devices. For 128-bit programming sub-windows, this speed advantage is increased to sixteen times.

Memory programming will be further described herein as being based on a 64-bit sub-window 520. One of ordinary skill in the art will recognize that other programming sub-window sizes could be used. For example, as briefly described above, 128-bit sub-windows may be used where the program window is 512 bits. Also, the concept of having a programming widow including sub-windows may alternatively be implemented as a single programming window without sub-windows or with a higher number of sub-windows (e.g., 8 or more).

Because parallel programming requires the application of programming pulses to numerous memory cells simultaneously, there is a risk that additional power may be necessary to accomplish the programming. For example, using conventional programming techniques, for a 64-bit program window, it may be necessary to program as many as 64 bits during a single programming operation. Such a requirement may exceed the capacity of the available power supply or power management capabilities of program voltage generator 122.

To use the power efficiently, a program technique referred to herein as the inverse programming method may be used to as a power conscious management scheme to ensure that at most, only half of these parallel bits (i.e., 32) actually need to be programmed to their respective memory cells during any single programming operation. Additionally, memory configuration bits that are not related to the substantive data may also need to be programmed with these 32 (maximum) number of bits. These configuration bits may include bits such as a spare bit, an indication bit, and a dynamic reference bit. In one implementation, a maximum of five configuration bits may need to be programmed for each sub-window 520, giving 37 total maximum bits for programming for each 64-bit sub-window 520.

In operation, the inverse programming method dynamically selects how to interpret a programmed cell 201 based on the data in sub-window 520. For example, if a non-programmed memory cell 201 (i.e., a cell with no stored charge) is normally interpreted as being a logical one (1), and sub-window 520 includes all logical zeros (0s), instead of programming all the bits in sub-window 520 (i.e., 64 bits), the non-programmed memory cells 201 in sub-window 520 may instead be interpreted as corresponding to a logic zero. In this manner, instead of programming all 64 bits of sub-window 520, none of the bits in sub-window 520 need to be programmed, resulting in a significant time and power savings. In this example, as few as one configuration bit may be programmed, such as the indication bit, to indicate that the memory cells in the sub-window are to be interpreted in an inverse manner, where non-programmed memory cells correspond to a logic zero, rather than the convention logical one.

The inverse programming technique can advantageously lead to less average power drain per bit that is programmed and less maximum current required per programming window. As an example of this, consider the exemplary situation in which 0.1 milliamps (mA) is needed to program one memory cell and a 64-bit programming window is being used. Without the programming techniques described herein, the 64-bit window may require as much as 6.4 mA of total current to program. If program voltage generator 122 is limited to supplying, for example, 4 mA of current, a 64-bit window could not be used. With the above described programming techniques, however, the maximum total current required for a 64-bit program window can be nearly cut in half (approximately 3.3 mA) to program 32 bits plus the configuration bits (e.g., the indication bit). In this situation, a 64 bit programming window could be used without exceeding the capacity of program voltage generator 122.

Figure 7:
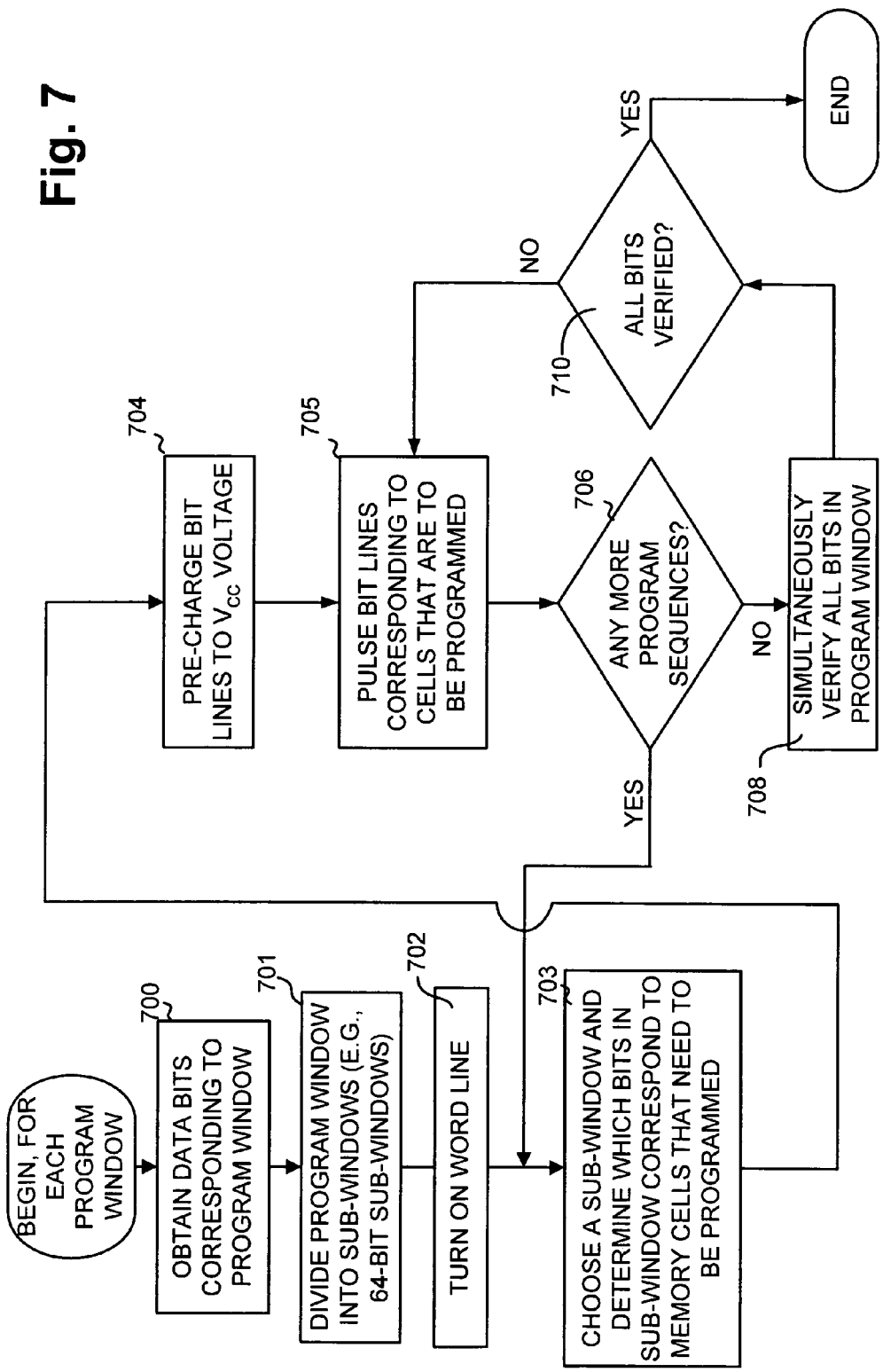
FIG. 7 is a flow chart illustrating exemplary programming of a memory device such as the memory device shown in FIG. 1.

FIG. 7 is a flow chart illustrating exemplary programming of a memory device such as memory device 100. A program window, such as program window 515, is obtained that includes the bits that are to be written to memory (act 700). As mentioned, one possible size for the program window may be a 256-bit program window. The program window may be divided into sub-windows 520, such as four 64-bit sub-windows (act 701). The word line corresponding to programming window 515 may then be activated by applying a relatively high voltage, such as 9V, to the word line (act 702). Data corresponding to each sub-window 520 may then be sequentially written to memory cells 201. In some possible implementations, multiple sub-windows may be simultaneously written.

For a select sub-window 520 that is to be written, logic in memory device 100, such as, for example, logic in Y-decoder circuitry 108 or state control 120, may determine which bits in the selected sub-window require programming (act 703). The inverse programming method may be used to minimize the required number of memory cells 201 that need to be programmed.

Physical attributes of core array 102 may result in pulse undershoot when simultaneously programming a large number of bits in a conventional manner. For example, array 102 may have be configured to include a "tall" configuration and long bit lines. The potential pulse undershoot may be defined as the difference between peak amplitude of the pulse and the desired steady-state pulse level. Pulse undershoot can be most severe following the programming of a sub-window that includes many bits to be programmed (e.g., 32 bits). In this situation, because each long bit line requires a constant current supply, program voltage generator 122 may experience a large current drain. In a conventional operation, this may require a time delay and a large charging current to enable programming of the next sub-window.

In accordance with one implementation consistent with the invention, this undershoot condition may be avoided or reduced by pre-charging the bit lines associated with the programming operation prior to applying any programming pulses (act 704). In one embodiment, the bit lines are pre-charged to a voltage supply ($V_{cc}$) level (e.g., from about 1.8 to about 3.3 volts). By pre-charging the bit lines corresponding to the cells 201 to be programmed, the bit lines are able to more quickly reach and stabilize to the required voltage level. Additionally, the charging current required to pulse the bit lines is reduced since the bit lines have been pre-charged. Further, by not pre-charging all bit lines, unnecessary power consumption is avoided. Following bit line pre-charging, the bit lines corresponding to the memory cells 201 that are to be programmed may be activated by pulsing the bit lines (act 705).

As previously mentioned, half or less of the 64 bits of 64-bit programming window 520 may actually need to be programmed. The select transistors S0-S7 for the non-programmed groups may remain in the "off" state (i.e., non-activated). That is, no voltage may be applied to the gates of the select transistors S0-S7 for each of the non-programmed groups.

Figure 8:
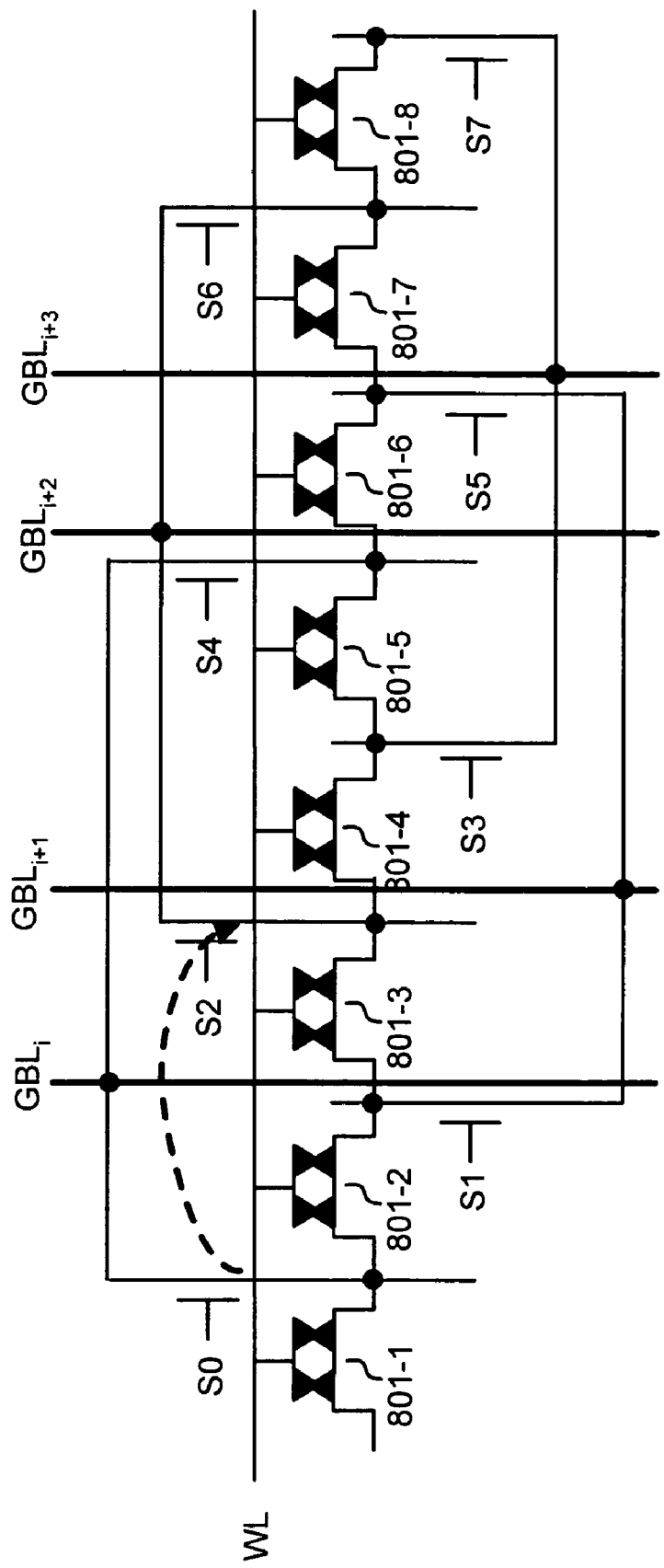
FIG. 8 is a diagram illustrating an exemplary word line and a corresponding group of memory cells.

FIG. 8 is a diagram illustrating an exemplary word line (WL) and a group of eight memory cells 801-1 through 801-8, each having bit lines controlled by corresponding select transistors S0-S7. A 64-bit programming window 520 may correspond to one bit within each of 64 of such groups of memory cells 201. As an example, assume that the left bit in memory cell 801-2 is to be programmed. In this situation, the left side of memory cell 801-2 is the drain and the right side of memory cell 801-2 is the source. Accordingly, a voltage (e.g., about 4.5 volts) may be applied to bit line $GBL_i$, select transistor S0 may be activated, bit line $GBL_{i+1}$ may be grounded, and select transistor S1 may be activated. The voltages applied to WL, $GBL_i$, and $GBL_{i+1}$ may be generated by program voltage generator 122.

Following programming of the current sub-window, acts 703-705 may be repeated for the other sub-windows in programming window 515 (act 706). Following programming of the memory bits designated by the program window 515 or sub-window 520, a program verify process is performed to ensure that the programming voltage applied to each memory cell adequately raised the threshold voltage for each memory cell to be programmed up to or above a predetermined reference voltage to actually program the appropriate memory cells. In accordance with principles of the invention, the program verify process may include simultaneously or parallel verifying each bit in the program window (act 708). In one implementation consistent with the invention, 256 bits may be program verified in parallel. By simultaneously verifying all 256 bits in program window 515, program verification of memory device 100 may be accomplished approximately sixteen to thirty-two times faster than conventional NOR memory devices. For 512-bit programming windows, this speed advantage is increased to as much as sixty-four times.

Figure 9:
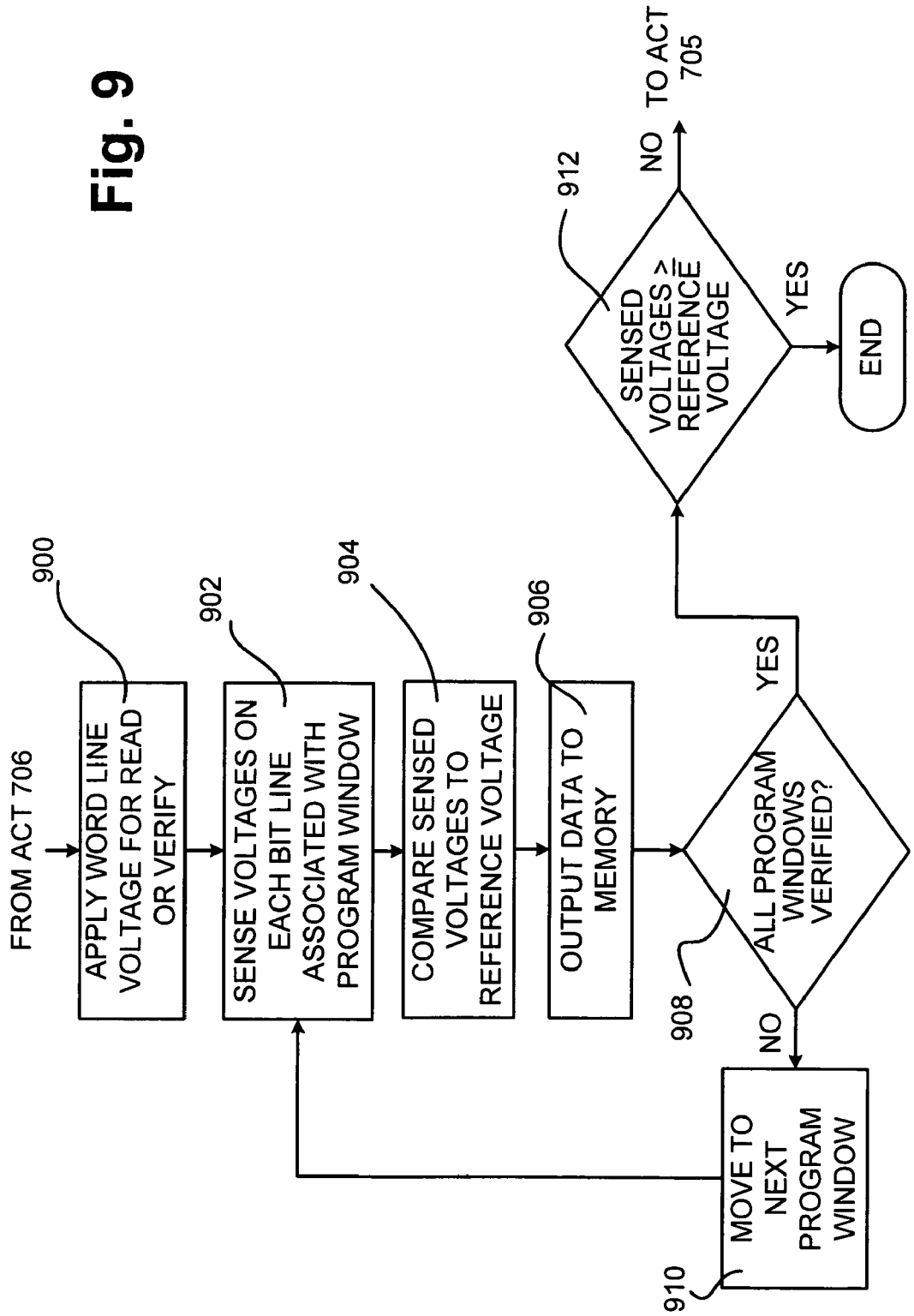
FIG. 9 is a flow chart illustrating one exemplary verify process shown in FIG. 7.

FIG. 9 is a flow chart illustrating one exemplary verify process of acts 708-710 in accordance with principles of the invention. Following a determination that each memory cell in the program window has been programmed (or, alternatively, that each memory cell in multiple program windows) in act 706 of FIG. 7, a read or verify word line voltage is applied to the program window (act 900). Next, a voltage is sensed on each bit line associated with the program window using a number of discrete sense amplifiers included within Y decoder/sense amplifier circuitry 108 (act 902). For example, if 256 bits are to be parallel verified or read, 256 sense amplifiers are required.

The sensed voltage is then compared against a reference voltage (act 904). Data relating to the sensed measurements is then read into memory 112 (act 906). Because discrete sense amplifiers (one for each bit line) are used, power consumption necessary to perform parallel verification increases substantially as the number of bits to be simultaneously verified is increased. To mitigate this power requirement, memory device 100 consistent with principles of the invention, may include low power sense amplifiers in sense amplifier circuitry 108 so as to reduce power consumption during the parallel verify operation.

Next, it is determined whether each program window or sub-window has been verified. As set forth above, multiple program windows or sub-windows may be verified in parallel, thereby improving programming speed. If it is determined that additional program windows need to be verified, the process moves to the next program window (act 910) and the process returns to act 902.

If it is determined that all program windows have been verified, it is next determined whether the sensed voltages meet or exceed the reference voltage (act 912). If it is determined that any of the sensed voltages do not meet or exceed the reference voltage, the process returns to act 705 of FIG. 7 where an additional program pulse is applied and the under-programmed bits are again program verified. However, if it is determined that each measured bit meets or exceeds the reference voltage, the program windows are considered verified and the process ends for the current program window or group of program windows. In accordance with principles of the invention, multiple programming windows may be verified simultaneously. Additionally, the program and verification processes of the invention may operate in a page mode that bridges multiple word lines (e.g., four word lines) for each operation.

Figure 10:
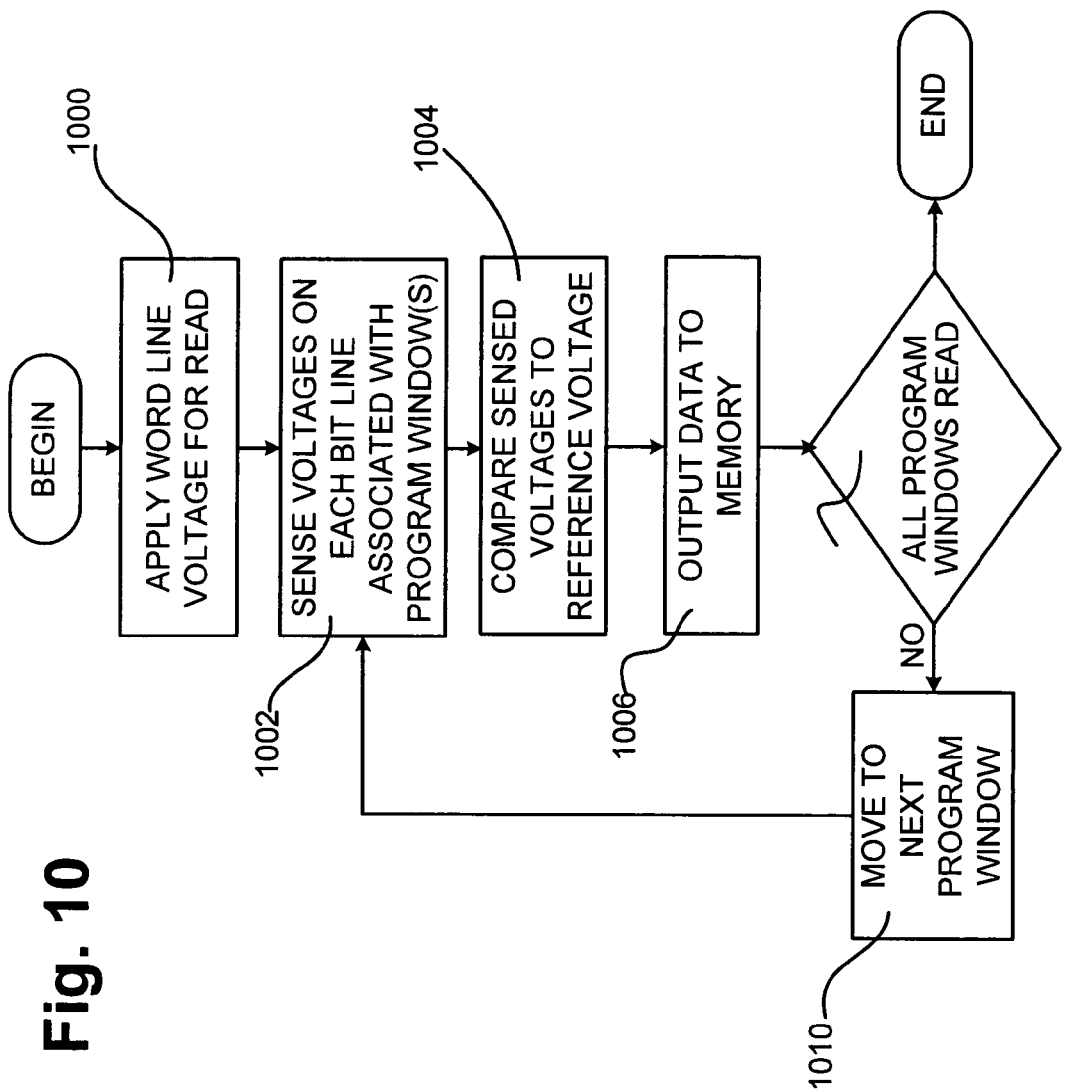
FIG. 10 is a flow chart illustrating exemplary reading of a memory device such as the memory device shown in FIG. 1.

Program verify and read operations for memory device 100 are substantially similar in that each process requires identification of the programming state of each memory cell 201 in device 100. The difference between the two operations lies in the voltages applied to the gates of the cells 201 currently being read/verified. FIG. 10 is a flow chart illustrating one exemplary read process in accordance with principles of the invention. Initially, a read word line voltage may be applied to the word line associated with the program window(s) to be read (act 1000). Next, a voltage is sensed on each bit line associated with the program window using a number of discrete sense amplifiers included within Y decoder/sense amplifier circuitry 108 (act 1002). For example, if 256 bits are to be parallel verified or read, 256 sense amplifiers are required.

The sensed voltage is then compared against a reference voltage (act 1004). Data relating to the sensed measurements is then read into memory 112 (act 1006). Because discrete sense amplifiers (one for each bit line) are used, power consumption necessary to perform parallel reads increases substantially as the number of bits to be simultaneously read is increased. To mitigate this power requirement, memory device 100 consistent with principles of the invention, may include low power sense amplifiers in sense amplifier circuitry 108 so as to reduce power consumption during the parallel read operations.

Next, it is determined whether each program window or sub-window has been read. As set forth above, multiple program windows or sub-windows may be read in parallel, thereby improving read speed. If it is determined that additional program windows need to be read, the process moves to the next program window (act 1010) and the process returns to act 1002. If it is determined that all program windows have been read, the read operation ends.

CONCLUSION

As described above, a number of programming techniques, such as parallel processing and power management may be performed to substantially increase program speed and power performance in a NOR-based memory device. A resulting memory device continues to exhibit the code-quality performance of NOR-based devices, while further exhibiting programming and page read speeds and efficient power management capabilities comparable to or exceeding those of conventional NAND-based flash memory devices.

The foregoing description of exemplary embodiments of the invention provides illustration and description, but is not intended to be exhaustive or to limit the invention to the precise form disclosed. Modifications and variations are possible in light of the above teachings or may be acquired from practice of the invention.

Moreover, while series of acts have been described with regard to FIG. 6, the order of the acts may be varied in other implementations consistent with the invention. Moreover, non-dependent acts may be implemented in parallel.

No element, act, or instruction used in the description of the invention should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed:

1. A method of programming a nonvolatile memory array including an away of memory cells, each memory cell including a substrate, a control gate, a charge storage element, a source region and a drain region, comprising:
  receiving a programming window containing a predetermined number of bits that are to be programmed in the array;
  determining which of the predetermined number of bits are to be programmed in the memory array;
  simultaneously programming the predetermined number of bits to corresponding memory cells in the array; and
  simultaneously verifying a programming state of the predetermined number of bits in the array.

2. The method of claim 1, further comprising:
  pre-charging bit lines associated with the predetermined number of bits prior to simultaneously programming the predetermined number of bits.

3. The method of claim 2, wherein the pre-charging bit lines associated with the predetermined number of bits comprises pre-charging bit lines to a voltage corresponding to a voltage source.

4. The method of claim 1, wherein the programming window includes 64 bits.

5. The method of claim 1, wherein the programming window includes 128 bits.

6. The method of claim 1, wherein the determining which of the predetermined number of bits are to be programmed in the away is based on an inverse programming method.

7. The method of claim 6, wherein the inverse programming method includes:
  determining whether the predetermined number of bits is greater than one half of the number of bits in the programming window, where bits in the programming window not included in the predetermined number of bits are the remaining bits;
  simultaneously programming the memory cells in the array corresponding to the remaining bits in the programming window if it is determined that the predetermined number of bits is greater that one half of the number of bits in the programming window; and setting an indication bit to a predetermined logic state indicative of whether the predetermined number of bits is greater than one half of the number of bits in the programming window.

8. The method of claim 1, wherein the simultaneously verifying a programming state comprises simultaneously verifying a programming state for a number of program windows.

9. The method of claim 1, wherein the simultaneously verifying includes:
determining whether the predetermined number of bits on the array are programmed; and wherein the method further comprises:
reprogramming any non-programmed bits in the predetermined number of bits.

10. The method of claim 1, wherein the simultaneously verifying a programming state comprises simultaneously verifying a programming state for 256 bits.

11. The method of claim 1, wherein the away of memory cells include SONOS (silicon-oxide-nitride-oxide-silicon) type NOR memory cells.

12. The method of claim 1, wherein the charge storage element comprises a dielectric charge storage element configured to store at least two independent charges for each memory cell.

13. A memory device comprising:
at least one away of non-volatile memory cells;
a voltage supply component configured to generate a programming voltage for simultaneously programming a plurality of the memory cells, the voltage supply component including a DC-to-DC converter; and
control logic configured to simultaneously program the plurality of memory cells, where the plurality of memory cells corresponds to a programming window including a predetermined number of bits to be programmed.

14. The memory device of claim 13, wherein the at least one array of non-volatile memory cells includes:
a plurality of bit lines each connected to source or drain regions of a plurality of the memory cells; and
a plurality of word lines, arranged orthogonally to the bit lines, each word line being connected to gate regions of a plurality of the memory cells.

15. The memory device of claim 14, wherein the memory cells include NOR-type memory cells.

16. The memory device of claim 14, further comprising:
a plurality of sense amplifiers operatively connected to the plurality of bit lines, where the plurality of sense amplifiers are low-power sense amplifiers; and
control logic configured to simultaneously verify a number of bits in programmed memory cells by monitoring a threshold voltage for each memory cell with a corresponding one of the plurality of sense amplifiers.

17. The memory device of claim 13, wherein the programming window includes 64 bits.

18. The memory device of claim 13 wherein the predetermined number of bits is 256 bits.

19. A memory device comprising:
a core array including at least one array of non-volatile memory cells, the at least one array comprising:
a plurality of bit lines each connected to source or drain regions of a plurality of the memory cells; and
a plurality of word lines, arranged orthogonally to the bit lines, each word line being connected to gate regions of a plurality of the memory cells;
a plurality of sense amplifiers operatively connected to the plurality of bit lines for sensing a threshold voltage for memory cells connected to the bit lines;
a voltage supply component configured to generate a programming voltage for simultaneously programming a plurality of the memory cells, the voltage supply component including a DC-to-DC converter;
control logic configured to receive a programming window containing a predetermined number of bits that are to be programmed in the at least one array, and determine which of the predetermined number of bits are to be programmed in the memory array;
control logic configured to pre-charge bit lines associated with the predetermined number of bits;
control logic configured to simultaneously program the predetermined number of bits to corresponding memory cells in the array; and
control logic configured to simultaneously verify a programming state of the predetermined number of bits in the array.

20. A memory device comprising:
a core array including at least one array of non-volatile memory cells, the at least one array comprising:
a plurality of bit lines each connected to source or drain regions of a plurality of the memory cells; and
a plurality of word lines, arranged orthogonally to the bit lines, each word line being connected to gate regions of a plurality of the memory cells;
control logic configured to receive a programming window containing a predetermined number of bits that are to be programmed in the at least one array, and determine which of the predetermined number of bits are to be programmed in the at least one array;
control logic configured to simultaneously program the predetermined number of bits to corresponding memory cells in the at least one array; and
control logic configured to simultaneously read a programming state of the predetermined number of bits in the at least one array.

21. The memory device of claim 20, further comprising:
a plurality of sense amplifiers operatively connected to the plurality of bit lines, where the plurality of sense amplifiers are low-power sense amplifiers; and
control logic configured to simultaneously read a number of bits in programmed memory cells by monitoring a threshold voltage for each memory cell with a corresponding one of the plurality of sense amplifiers.

* * * * *

UNITED STATES PATENT AND TRADEMARK OFFICE
CERTIFICATE OF CORRECTION

PATENT NO. : 7,443,732 B2  Page 1 of 1
APPLICATION NO. : 11/229527
DATED : October 28, 2008
INVENTOR(S) : Tiao-Hua Kuo et al.

It is certified that error appears in the above-identified patent and that said Letters Patent is hereby corrected as shown below:

Column 12, line 32 reads: "including an away of memory cells, each memory cell includ-", and should correctly read as follows: "including an array of memory cells, each memory cell includ-".

Column 12, line 58 reads: "the away is based on an inverse programming method.", and should correctly read as follows: "the array is based on an inverse programming method."

Column 13, line 22 reads: "11. The method of claim 1, wherein the away of memory", and should correctly read as follows: "11. The method of claim 1, wherein the array of memory".

Column 13, line 30 reads: "at least one away of non-volatile memory cells;" and should correctly read as follows: "at least one away of non-volatile memory cells;".

Signed and Sealed this

Twenty-third Day of December, 2008

JON W. DUDAS
*Director of the United States Patent and Trademark Office*